US008942655B2

(12) United States Patent
Beamish et al.

(10) Patent No.: US 8,942,655 B2
(45) Date of Patent: Jan. 27, 2015

(54) INTEGRATED CIRCUIT, WIRELESS COMMUNICATION UNIT AND METHOD FOR DETERMINING QUADRATURE IMBALANCE

(75) Inventors: Norman Beamish, Cork (IE); Conor O'Keeffe, Cork (IE); Patrick Pratt, Mallow (IE)

(73) Assignee: Freescale Semiconductor, Inc., Austin, TX (US)

( * ) Notice: Subject to any disclaimer, the term of this patent is extended or adjusted under 35 U.S.C. 154(b) by 686 days.

(21) Appl. No.: 12/600,687

(22) PCT Filed: May 31, 2007

(86) PCT No.: PCT/IB2007/052048
§ 371 (c)(1),
(2), (4) Date: Nov. 18, 2009

(87) PCT Pub. No.: WO2008/146096
PCT Pub. Date: Dec. 4, 2008

(65) Prior Publication Data
US 2010/0167674 A1    Jul. 1, 2010

(51) Int. Cl.
| H04B 17/00 | (2006.01) |
| H04B 1/10 | (2006.01) |
| H04B 1/26 | (2006.01) |
| H04B 1/16 | (2006.01) |
| H03D 3/00 | (2006.01) |
| H04B 1/30 | (2006.01) |
| H04L 27/00 | (2006.01) |

(52) U.S. Cl.
CPC ............... *H03D 3/009* (2013.01); *H04B 1/30* (2013.01); *H04L 27/0014* (2013.01)

USPC ........ 455/226.1; 455/305; 455/312; 455/313; 455/337

(58) Field of Classification Search
CPC ........... H04B 1/30; H04B 1/406; H03D 3/009
USPC ........... 455/226.1–226.4, 283, 295–296, 302, 455/305, 309–313, 337
See application file for complete search history.

(56) References Cited

U.S. PATENT DOCUMENTS

| 6,597,748 B1 * | 7/2003 | Hietala et al. ................. 375/324 |
| 6,785,529 B2 | 8/2004 | Ciccarelli et al. |
| 6,892,060 B2 | 5/2005 | Zheng |
| 7,031,672 B2 | 4/2006 | Malone et al. |
| 7,031,688 B2 | 4/2006 | Malone et al. |

(Continued)

FOREIGN PATENT DOCUMENTS

| GB | 2345230 A | 6/2000 |
| WO | 03/003686 A | 1/2003 |

OTHER PUBLICATIONS

International Search Report and Written Opinion correlating to PCT/IB2007/052048 dated Jan. 21, 2008.

*Primary Examiner* — Simon Nguyen (57) ABSTRACT

An integrated circuit comprising processing logic for operably coupling to radio frequency (RF) receiver circuitry arranged to receive a wireless network signal. The receiver circuitry generates in-phase and quadrature digital baseband representations of the wireless network signal. The processing logic determines quadrature (I/Q) imbalance of the RF receiver circuitry based on the in-phase and quadrature digital baseband representations of the wireless network signal.

19 Claims, 5 Drawing Sheets

(56) References Cited

U.S. PATENT DOCUMENTS

| | | |
|---|---|---|
| 7,130,359 B2 * | 10/2006 | Rahman .................. 375/316 |
| 7,136,431 B2 * | 11/2006 | Shi et al. ................. 375/319 |
| 7,248,625 B2 * | 7/2007 | Chien ...................... 375/219 |
| 7,366,255 B1 * | 4/2008 | Hwang et al. ............ 375/324 |
| 7,463,871 B2 * | 12/2008 | Li ............................ 455/130 |
| 7,496,340 B1 * | 2/2009 | Chen et al. ............... 455/296 |
| 7,580,692 B2 * | 8/2009 | Kravets .................... 455/302 |
| 7,593,491 B1 * | 9/2009 | Khlat et al. .............. 375/344 |
| 7,773,965 B1 * | 8/2010 | Van Brunt et al. ....... 455/226.1 |
| 7,804,911 B2 * | 9/2010 | Meltzer et al. ........... 375/268 |
| 7,962,113 B2 * | 6/2011 | Gao et al. ................. 455/296 |
| 7,965,994 B2 * | 6/2011 | Darabi ...................... 455/296 |
| 8,036,317 B2 * | 10/2011 | D'Alessandro ........... 375/324 |
| 8,102,943 B1 * | 1/2012 | Khlat et al. .............. 375/316 |
| 2003/0003891 A1 | 1/2003 | Kivekas et al. |
| 2004/0058661 A1 * | 3/2004 | Hsu et al. ................. 455/311 |
| 2004/0081256 A1 * | 4/2004 | Shi et al. .................. 375/317 |
| 2006/0083335 A1 * | 4/2006 | Seendripu et al. ....... 375/332 |
| 2008/0057899 A1 * | 3/2008 | Montemayor et al. ... 455/255 |
| 2010/0022208 A1 * | 1/2010 | Cole et al. ................ 455/114.3 |
| 2010/0220825 A1 * | 9/2010 | Dubuc et al. ............. 375/346 |

* cited by examiner

INTEGRATED CIRCUIT, WIRELESS COMMUNICATION UNIT AND METHOD FOR DETERMINING QUADRATURE IMBALANCE

FIELD OF THE INVENTION

The field of the invention relates generally to an integrated circuit, a wireless communication unit and a method for determining quadrature imbalance.

BACKGROUND OF THE INVENTION

Wireless communication units, for example those operating in a cellular telephone system such as the Global System for Mobile communications (GSM), are known to use a broadcast reference frequency signal, sent on for example a Frequency Correction Channel (FCCH), to calibrate their operating (transmit/receive) frequency. The broadcast signal is generally transmitted from one or more base transceiver stations (BTSs). The wireless communication units use the frequency correction signal to synchronise their internal frequency generation circuits to a centralized timing system. The wireless communication units synchronise their operating frequency to match the system frequency, prior to entering into a communication. Such frequency correction techniques have also been adopted by a number of enhanced digital cellular telecommunication technologies, including general packet radio system (GPRS), enhanced general packet radio system (EGPRS) transceivers that cover low band GSM850, enhanced GSM (EGSM), high band digital communication system DCS1800 and personal communication system PCS1900 frequencies, as defined by the $3^{rd}$ Generation Partnership Project 3GPP (previously standardised by European Telecommunication Standards Institute (ETSI)).

It is known to use Very Low Intermediate Frequency (VLIF) radio receivers within such wireless communication units. Such radio receivers provide the advantage over, for example, a traditional heterodyne architecture in that they comprise lower power consumption, and enable a high level of integration within an integrated circuit package.

However, a known problem with VLIF receivers is that, due to their low intermediate frequencies, it is not easy to remove radio interference using conventional filtering techniques. Consequently, for VLIF receivers, arranged to perform quadrature amplitude demodulation, it is important for the quadrature (I/Q) balancing of the receiver circuitry to be as accurate as possible, in order to minimise the effect of in-band interference due to blocking interferer signals.

Quadrature imbalance is created due to small differences in the tolerances of components in respective 'I' and 'Q' paths of the receiver circuitry. These small differences in the tolerances in the respective 'I' and 'Q' paths can result in a phase skew and/or gain imbalance between the two paths, resulting in a quadrature (I/Q) imbalance.

Radio frequency (RF) circuitry components are typically integrated within an RF integrated circuit package (RFIC), in order to provide close tolerance and better matching between the various RF circuitry components. This is particularly important when circuits are duplicated, for example to support independent quadrature signal manipulation. However, even close tolerances of components between quadrature circuits still causes variations in both the gain and the phase shift of signals. Consequently, it is necessary to calibrate individual devices in order to compensate for imbalance between the 'I' and 'Q' paths. Accordingly, it is known to provide measurement functionality within the RFIC, in order to measure quadrature imbalance, and thereby to enable any necessary calibration adjustments of the RF circuitry to be made. For example, gain imbalance of 'X' dB may be corrected by applying a compensating gain imbalance of '−X' dB in the baseband, so that the net result is 0 dB gain imbalance. Similarly with a phase imbalance of '$Y^o$' a compensating phase imbalance of $-Y^o$ may be applied also in the baseband. Mechanisms to apply these compensating signals are well understood in the industry.

As will be appreciated by a skilled artisan, it is generally the case that a manufacturer of wireless communication units incorporating RF receivers uses RFICs designed and manufactured by a third party, i.e. a supplier. A problem with such manufacturing is that it is sometimes the case that the measurement functionality, to measure quadrature imbalance, does not function correctly or is not sufficiently accurate. Furthermore, some suppliers may not incorporate measurement functionality within their RFICs at all. Consequently, the manufacturer of the wireless communication units is not able to rely on the availability of such measurement functionality within an RFIC, and even when available, on the measurement functionality functioning correctly.

As previously mentioned, it is known to integrate the RF circuitry components within an RFIC. Therefore, in the case where measurement functionality is not provided within the RFIC, or when the functionality is provided, but is not functioning correctly, it is necessary to use an output from the RFIC, generally a Digital Baseband (DBB) signal, to determine the quadrature imbalance parameters.

Currently, it is known to measure quadrature imbalance and perform calibration during factory testing of devices, where a test signal is provided as an input to the RF circuitry, and the DBB output signal is measured to determine any quadrature imbalance. Calibration and correction can then be performed in order to compensate for imbalance within the quadrature demodulation circuitry as accurately as possible.

By way of example, U.S. Pat. No. 6,785,529 describes a system and method of compensating for an imbalance between the 'I' and 'Q' paths of a low intermediate frequency or zero intermediate frequency receiver. The method described utilises a single frequency signal as a test signal to measure gain/phase imbalance between 'I' and 'Q' paths. The test signal is generated using a signal generator in a laboratory or factory environment.

It is becoming increasingly desirable to minimise factory testing in order to minimise costs. Accordingly, the need to perform quadrature imbalance measurements and calibration during factory testing is undesirable. However, without such measurements and calibration techniques, accurate quadrature balancing cannot be reliably provided, and as such performance of the RF circuitry is likely to be significantly affected.

Thus, a need exists for an improved integrated circuit, wireless communication unit and method for determining quadrature imbalance.

SUMMARY OF INVENTION

In accordance with aspects of the invention, there is provided an integrated circuit comprising processing logic adapted to determine quadrature imbalance, a method for determining quadrature imbalance, and a wireless communication unit comprising such a semiconductor device and/or processing logic arranged to perform the method thereof, as defined in the appended Claims.

DESCRIPTION OF EMBODIMENTS

Embodiments of the invention will now be described in terms of a wireless communication unit, such as a mobile telephone handset. Although embodiments of the invention will be described in terms of a wireless communication unit, such as a mobile telephone handset, it will be appreciated that the inventive concept herein described may be embodied in any apparatus that incorporates radio frequency receiver circuitry adapted to perform quadrature amplitude demodulation.

In summary, the inventive concept proposes a method and apparatus for determining quadrature (I/Q) imbalance within radio frequency (RF) circuitry. In particular, the inventive concept proposes a an integrated circuit comprising processing logic arranged to determine I/Q imbalance within RF receiver circuitry; wherein the processing logic is arranged to receive in-phase and quadrature components of a network signal, in a form of digital baseband signals and to determine I/Q imbalance based on measurements of the received in-phase and quadrature components.

Figure 1:
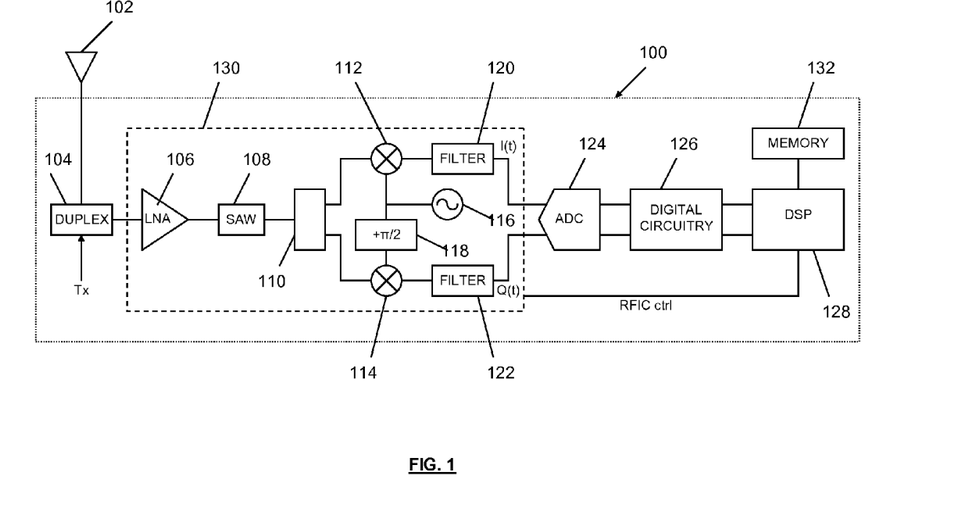
FIG. 1 illustrates a block diagram of part of a wireless communication unit, arranged to support the inventive concept of an embodiment of the invention.

Referring now to FIG. 1, there is illustrated a block diagram of part of a wireless communication unit 100, adapted to support the inventive concept of an embodiment of the invention. The communication unit 100, in the context of the illustrated embodiment of the invention, is a mobile telephone handset comprising an antenna 102. The wireless communication unit comprises a transmitter chain and a receiver chain, each coupled to the duplex filter 104, which provides isolation therebetween.

For clarity, only those parts of the wireless communication unit necessary for describing the inventive concept are illustrated in FIG. 1. In particular, transmitter chain circuitry, which is well known in the art, has been omitted.

With regard to the receiver chain, as illustrated in FIG. 1, the duplex filter 104 is coupled to a low noise amplifier (LNA) 106, which is in turn coupled to a filter, for example surface acoustic wave (SAW) filter 108. In this manner, a wireless network signal, in a form of a radio frequency (RF) signal received by the antenna 102 is passed to the duplex filter 104, which routes the received signal to the LNA 106, which in turn amplifies the signal. The SAW filter 108 then filters the amplified signal to remove unwanted signals outside of a desired frequency range.

The filtered signal is then provided to a signal splitter 110, which divides the received signal into two substantially matching signals. Each of the divided signals is then provided to a mixer 112, 114. The mixers 112, 114 mix the divided signals with frequency shifting signals generated by a local oscillator (LO) 116. In this manner, the divided signals from the splitter 110 are shifted in frequency to an intermediate frequency.

A phase shifter 118 is provided between the local oscillator 116 and one of the mixers, which for the illustrated embodiment is mixer 114. The phase shifter 118 applies a $\pi/2$ (90 degree) phase shift to the LO signal prior to the mixer 114, thereby mixing the signal from the local oscillator with the divided signal. In this manner, the divided signals, having been shifted in frequency to the intermediate frequency, comprise the same intermediate frequency, but with a $\pi/2$, or 90 degree phase difference. In this manner, the frequency shifting circuit creates an in-phase component I(t) and a quadrature component Q(t).

The in-phase and quadrature (I/Q) components are then filtered, by filters 120, 122 before being provided to an analogue to digital converter, such as delta-sigma analogue to digital converter (ADC) 124, which converts the received analogue I/Q components into digital representations of the I/Q components.

For the embodiment illustrated in FIG. 1, the digital I/Q components from the ADC 124 pass through further digital circuitry 126 before reaching processing logic, such as digital signal processor (DSP) 128, in a form of digital baseband (DBB) representations of the wireless network signal. In this manner, the processing logic is operatively coupled to the RF circuitry, which for the illustrated embodiment is in provided within a radio frequency integrated circuit (RFIC) 130. The digital circuitry 126 may comprise digital filters, DC correction circuitry, intermediate-to-baseband frequency shifting circuitry, etc., as required. The DSP 128 may form part of a Baseband Integrated Circuit (BBIC). The digital circuitry 126 may also be integrated within the BBIC, or alternatively may be provided discrete from the BBIC.

For the illustrated embodiment, the wireless communication unit 100 comprises a very low intermediate frequency (VLIF) receiver. As previously mentioned, a problem with VLIF receivers is that, due to their low intermediate frequencies, it is not easy to remove interference using conventional filtering techniques. Consequently, for VLIF receivers arranged to perform quadrature amplitude demodulation, it is important for the quadrature balancing of the receiver circuitry to be as accurate as possible, in order to minimise the effect of in-band interference due to blocking interference signals, 1/f noise, DC offsets, etc.

In accordance with embodiments of the invention, the processing logic, which for the illustrated embodiment is in a form of the DSP 128, is arranged to determine quadrature (I/Q) imbalance based on measurements of the received in-phase and quadrature components, and to calibrate the receiver chain circuitry to compensate for imbalance of the I/Q components, based on these measurements. Accordingly, for the illustrated embodiment the DSP 128 is coupled to the RFIC 130 via an RFIC control signal (RFIC ctrl). The signal sent from the RFIC to the DSP will typically be a sequence of digital words. Each word represents an IQ sample pair. When the DSP receives this data it will typically pass it through a digital filter, an equalizer and will perform timing and frequency recovery on the signal.

Figure 2:
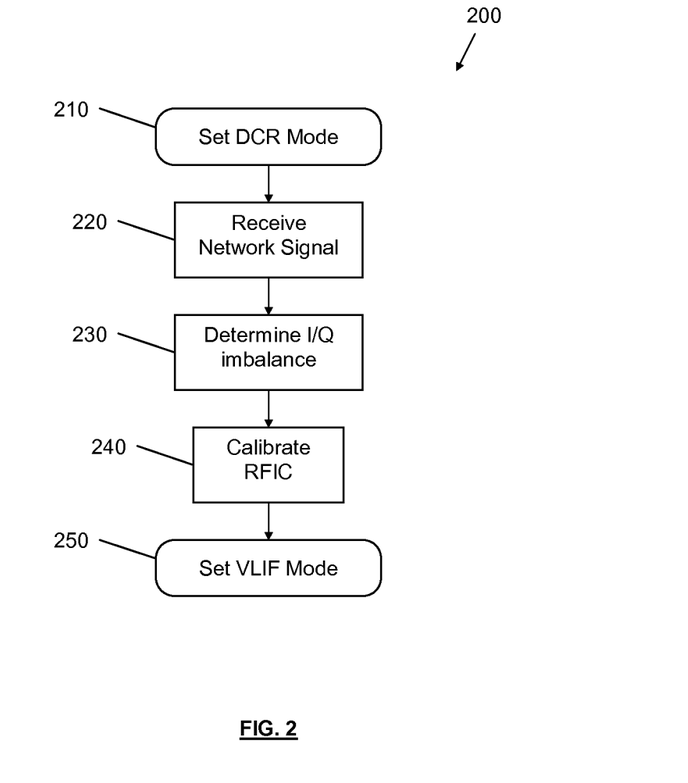
FIG. 2 illustrates a flow chart of a method for determining quadrature (I/Q) imbalance according to a first embodiment of the invention.

Referring now to FIG. 2, there is illustrated a flow chart of a method 200 for determining quadrature (I/Q) imbalance according to a first embodiment, and which, for example, may be performed by the DSP 128 of FIG. 1.

The method starts at step 210, where RF receiver circuitry is set to operate in direct conversion radio (DCR) mode. In DCR mode, the divided signals are frequency shifted directly to the DBB frequency, as opposed to an intermediate frequency. For the embodiment illustrated in FIG. 1, the RFIC 130 is set to operate in DCR mode by the DSP 128 via RFIC ctrl, which in effect results in the local oscillator generating a signal which, when mixed with a received signal, shifts the frequency of the received signal to the baseband frequency, as opposed to an intermediate frequency. The DSP 128, when setting the RFIC 130 to operate in DCR mode, may also set the digital circuitry to operate in DCR mode.

DCR mode is entered when the VLIF value is set to zero. The BBIC might send the actual VLIF offset value to the RFIC. Alternatively, the BBIC may send a command mode=DCR or mode=VLIF to the RFIC.

Next, in step 220, a network signal is received. For the embodiment illustrated in FIG. 1, a network signal is received via the antenna 102 and RF receiver circuitry 130, and divided and frequency shifted to the baseband frequency into I/Q components. The I/Q components are then received by the DSP 128.

The next step, step 230, comprises determining I/Q imbalance. As is well known in the art, an I/Q imbalance may be generated as a result of differential phase shifts and/or differential gains created between the 'I' and 'Q' paths. The result of such differential phase shifts and/or differential gains is a phase skew and/or gain imbalance between the in-phase and quadrature components. Accordingly, in accordance with embodiments of the invention, the DSP 128 may determine an I/Q imbalance by performing a cross-correlation between the received in-phase and quadrature signal components. In this manner, the DSP 128 determines any phase skew between the two components, and measuring the energy ratio between the in-phase and quadrature signal components to determine any gain imbalance therebetween.

Having determined any I/Q imbalance, the next step, step 240, is to calibrate the RF receiver circuitry in order to compensate for imbalance between the in-phase and quadrature signal components. Thus, for the illustrated embodiment, the DSP 128 calibrates the RFIC 130 via RFIC ctrl in FIG. 1. Such calibration may employ any known mechanism, for example the mechanism described in the earlier background section.

As will be appreciated, if it is determined, in step 230, that if no I/Q imbalance is present, step 240 may be omitted.

Once the RF receiver circuitry has been calibrated, the method moves to step 250, with the receiver circuitry being set to operate in a very low intermediate frequency (VLIF) mode. In the same way as for step 210, for the illustrated embodiment the RFIC 130 is set to operate in VLIF mode by the DSP 128 via RFIC ctrl, whereby the local oscillator generates a signal which, when mixed with a received signal, shifts the frequency of the received signal to the required intermediate frequency.

One advantage provided by the method of FIG. 2 is the use of a network signal for the purposes of determining an I/Q imbalance. By utilising a network signal, I/Q balancing may be performed without the need for test equipment. Consequently, the need to calibrate the RF receiver circuitry during factory testing is substantially alleviated.

Furthermore, environmental conditions, such as temperature, can affect the performance of RF circuitry components. Consequently, even if the RF receiver circuitry is accurately calibrated, use of the wireless communication unit in environmental conditions different to those under which the calibration was performed, may result in a quadrature (I/Q) imbalance. Accordingly, by utilising a network signal to determine I/Q imbalance, determination of I/Q imbalance is not limited to being performed during factory testing under controlled environmental conditions. Indeed, determination of I/Q imbalance may be performed periodically, and in particular during general use of the wireless communication unit, enabling any environmental affects upon I/Q balance to be compensated for.

Figure 3:
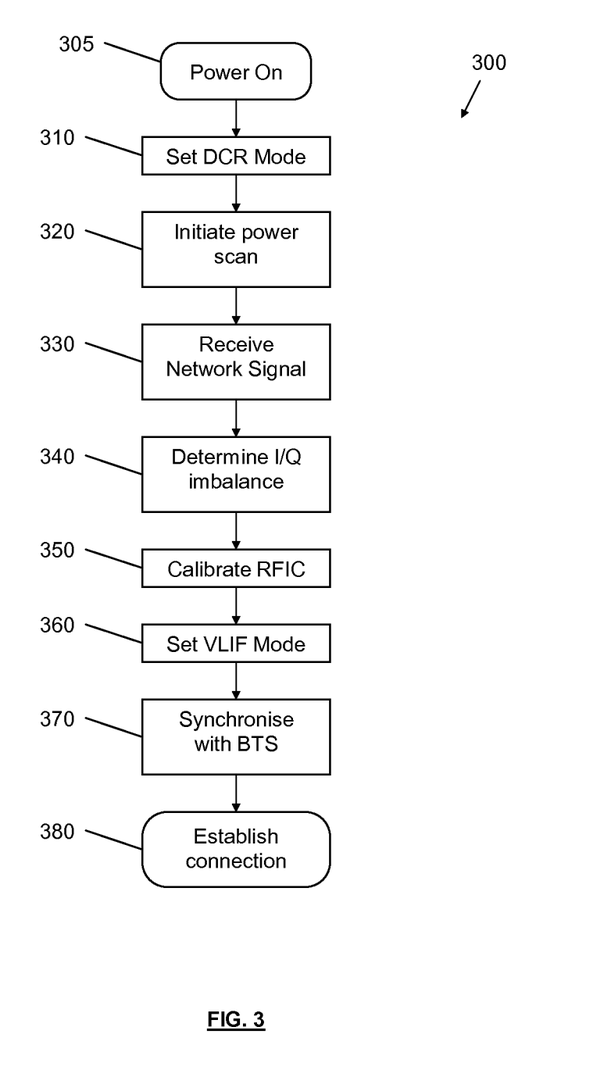
FIG. 3 illustrates a flow chart of a method for determining quadrature (I/Q) imbalance according to a second embodiment of the invention.

Referring now to FIG. 3, there is illustrated a flow chart of a method 300 for determining quadrature (I/Q) imbalance according to a second embodiment of the invention.

The method starts at step 305, when the wireless communication unit is powered on. Next, in step 310, the RF receiver circuitry is set to operate in DCR mode, for example in the same way as for step 210 in FIG. 2. Having set the RF receiver circuitry to operate in DCR mode, the next step is to initiate a power scan, in step 320. As is known in the art, a power scan is a process performed by, for example, a mobile telephone handset, whereby the RF circuitry scans through frequency channels in order to locate those frequency channels over which a network signal is being broadcast. Thereafter, the processing of the scan determines the most favourable frequency channel with which to communicate with a network. Accordingly, as part of the power scan, a network signal is received, in step 330.

The next step, step 340, comprises determining whether an I/Q imbalance exists, for example in the same manner as described above in relation to step 230 of FIG. 2. Having determined whether an I/Q imbalance is present, the next step is to calibrate the RF receiver circuitry, in step 350, in order to compensate for imbalance between the in-phase and quadrature component signals. In the same way as for the method of FIG. 2, if it is determined, in step 340, that no I/Q imbalance is present, then step 350 may be omitted.

Next, in step 360, the RF receiver circuitry is set to operate in VLIF mode. Having set the RF receiver circuitry to operate in VLIF mode, the next step 370 comprises synchronising with, for example, a base station with which a connection to a network is to be established, and finally to establish a connection with the network, in step 380. The steps of synchronising with a base station and establishing a network connection are well known in the art, and shall not be described in further detail here.

The method 300 of FIG. 3 provides the advantage of using a network signal received during the power scan process, for example following the powering on of the wireless communication unit.

In this manner, any necessary calibration can be performed prior to establishing a network connection. Consequently, when a network connection is subsequently made, the RF circuitry will have been calibrated, and any I/Q imbalance directed will have been corrected.

Furthermore, it is envisaged that the method 300 of FIG. 3 may be performed each time the wireless communication unit is powered on. In this manner, the effects of environmental conditions on the I/Q balance may be regularly taken into consideration, and compensated for.

Figure 4:
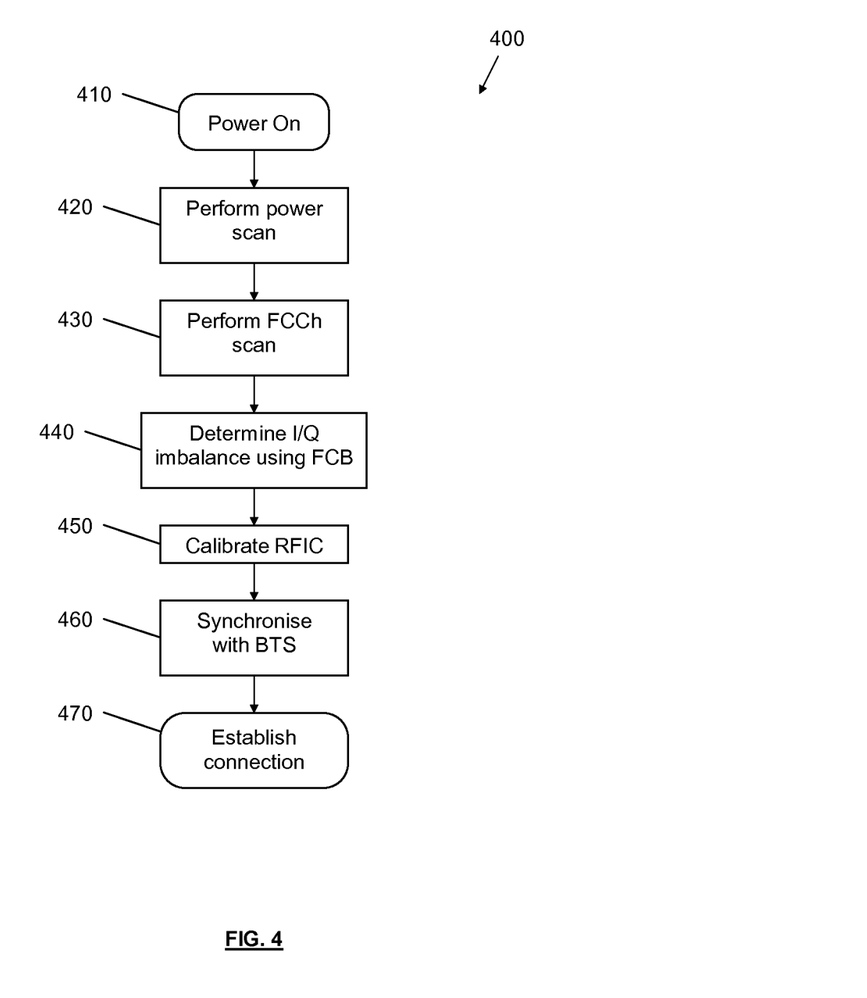
FIG. 4 illustrates a flow chart of a method for determining quadrature (I/Q) imbalance according to a third embodiment of the invention.

Referring now to FIG. 4, there is illustrated a flow chart of a method 400 for determining quadrature (I/Q) imbalance according to a third embodiment of the invention.

The method starts at step 410, when the wireless communication unit is powered on. Next, in step 420, a power scan is performed. As is well known in the art, for mobile communication technologies, such as the Global System for Mobile communications (GSM), General Packet Radio System (GPRS), Universal Mobile Telecommunications System (UMTS), etc., once a wireless communication unit has performed a power scan, and identified a frequency channel over which a network signal is being broadcast, the RF receiver circuitry performs a scan for the frequency control channel (FCCh) within the frequency channel identified. The FCCh generally comprises a time slot within the frequency channel, and within which a frequency correction burst (FCB) is transmitted.

Typically, the FCB comprises a sequence of zeros. Such a sequence is relatively easy to identify within a signal. Accordingly, the wireless communication unit performs an FCCh scan, whereby the wireless communication unit looks for this sequence of zeros to locate the FCCh. Once the wireless communication unit locates the FCCh, it is able to synchronise its timing with that of the base station transmitting the signal comprising the FCCh. Further information on the FCCh and the FCB can be found in the $3^{rd}$ Generation Partnership Project (3GPP) standard TS 45.002.

Referring back to FIG. 4, having performed the power scan in step 420, the next step is to perform an FCCh scan, in step 430, i.e. the time slot within the frequency channel. Next, in step 440, I/Q imbalance is determined using the FCB within the FCCh.

Having determined any I/Q imbalance, in step 440, the method moves on to step 450, where the RF receiver circuitry is calibrated, if necessary, to compensate for the I/Q imbalance. The wireless communication unit then synchronises with a base station, in step 460, and establishes a network connection, in step 470.

Using the FCB for the purposes of determining I/Q imbalance provides the advantage that the FCB comprises a predictable sinusoidal tone. In this manner, for the wireless communication unit illustrated in FIG. 1, the DSP 128 is able to compare measurements from the in-phase and quadrature signal components from a received FCCh signal with expected values stored, for example, within memory element 132. Any variation between measurements from the received in-phase and quadrature signal components and the expected values from these signal components can then be used to determine I/Q imbalance.

Figure 5:
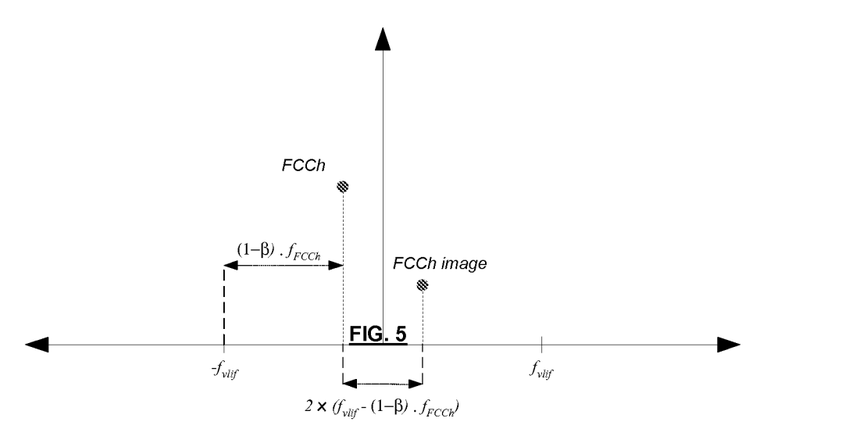
FIG. 5 illustrates an example of a frequency control channel tone and corresponding image tone without intermediate frequency shifting (e.g. before VLIF demodulation).

The effect of quadrature imbalance on an FCCh signal is to generate an image tone, equidistant, but at the opposite side of the FCCh frequency, as shown in the spectral plot of FIG. 5. In order to measure the quadrature imbalance accurately, both the FCCh tone and the generated image tone from any I/Q imbalance should be processed by the DSP 128 without the receive filtering removing the generated image tone. This may be achieved by configuring the VLIF frequency (by modifying the generated frequency of the local oscillator 116) such that the FCCh tone and the generated image tone are passed by the receiver filtering, as illustrated in the spectral plot of FIG. 6. For example, the VLIF frequency might be configured such that the FCCh tone lies between the VLIF frequency and DC.

Figure 6:
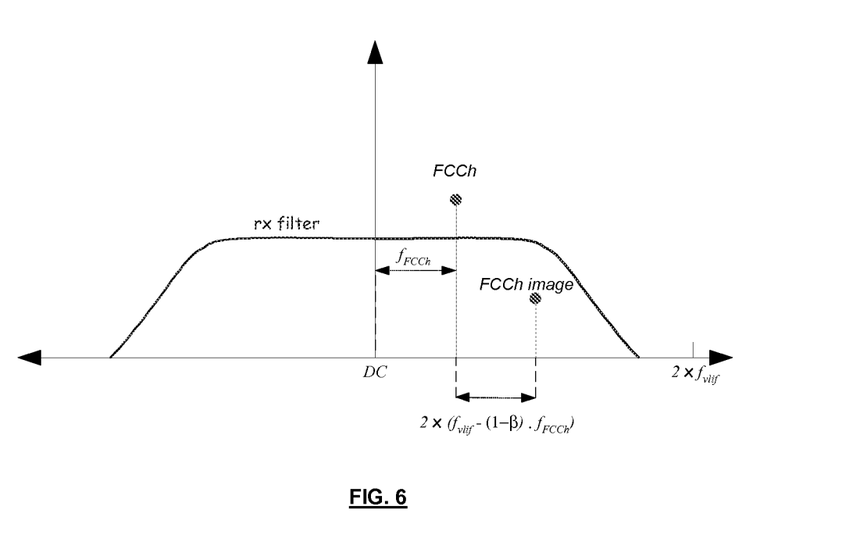
FIG. 6 illustrates an example of a frequency control channel tone and corresponding image tone with intermediate frequency shifting (e.g. after VLIF demodulation).

Thus, FIG. 5 illustrates an example of the FCCh tone and its image before the VLIF demodulation operation. In this regard, FIG. 5 illustrates a frequency domain representation of an FCCh tone and the image that is generated by any quadrature imbalance in the radio receiver. FIG. 6 illustrates an example of the FCCh tone and its image after the VLIF demodulation.

Referring again to FIG. 1, the contents of the 'I' path and the 'Q' path represent respectively the real and imaginary components of a complex sequence. If either path is individually examined in the frequency domain it will be seen to have energy at both positive and negative frequencies. Assuming the VLIF is a positive frequency, then if the 'I' and 'Q' paths are perfectly balanced, and combined as a complex number, then the energy contribution at negative frequencies of the 'I' path will exactly cancel out that of the 'Q' path. Hence, the complex signal will only have energy at positive frequencies. The reverse is true if the VLIF is a negative frequency. If quadrature imbalance exists then the energy cancellation described here is not total and some residual energy will remain to form the image as illustrated in FIG. 5.

As a receiver typically contains channel filtering, say in a form of the known digital circuitry 126 it is necessary to ensure that the FCCh signal and the image tone are both passed through the filter without being attenuated beyond the point of measurement. Therefore, it is desirable to choose the VLIF frequency, and its sign, to ensure that at the input to the ADC 124, the FCCh tone energy lies between the VLIF frequency and zero. If this condition is not met, then either the FCCh tone or its image will fall outside of the passband of the channel filter and will be significantly attenuated. This will degrade the measurement of the quadrature imbalance.

The quantity $\beta$ indicated in FIG. 5 and FIG. 6 represents an intentional offset that can be added to mixer 112, 114 of FIG. 1 to shift the VLIF frequency in order to ensure that the FCCh tone energy is located at the desired frequency at the input to ADC 124. It is noteworthy that it is only during the FCCh reception period that the frequency offset will be added to mixers 112, 114 and that during normal operational mode this offset will not be present.

In this manner, as the FCB comprises a predictable tone, the VLIF frequency may be configured to enable quadrature imbalances to be determined, without a need to set the RF receiver circuitry into a DCR mode. However, even for such a predictable received signal, frequency shifting of the received signal, and the consequent shifting of imbalance generated images, makes imbalance determination more complicated. Accordingly, even when using the FCB to determine quadrature imbalance, setting the RF receiver circuitry to operate in a DCR mode simplifies the process of determining I/Q imbalance.

As will be appreciated by a skilled artisan, typically the FCB detection process measures the frequency of the FCB through a combination of filtering and energy detection, say using a digital signal processor employing Fast Fourier transform logic. Accordingly, detection of the FCB within the FCCh channel will generally not be affected by quadrature imbalance. Consequently, it is generally not necessary for the RF circuitry to be accurately calibrated (for example during factory testing, in order for the FCCh scan to be performed, and normal FCB detection is not impaired by simultaneous determination of quadrature imbalance.

It is envisaged that determination of quadrature balancing is not limited to being performed upon powering on of the wireless communication unit. Indeed, it is contemplated that determination of quadrature imbalance may be performed regularly. Additionally, it is contemplated that determination of quadrature imbalance is not limited to being performed on a single frequency channel, but may be performed on each frequency channel, to take into consideration any variation therebetween in the quadrature balancing.

Referring back to FIG. 1, by enabling the processing logic, which for the illustrated embodiment comprises the DSP 128, to determine quadrature imbalance from the DBB signal, the need to provide, or rely on, quadrature imbalance measurement functionality within the RFIC is substantially alleviated.

It will be understood that the method, integrated circuit, and wireless communication unit employing the method or integrated circuit, as described above, aim to provide at least one or more of the following advantages:

(i) Removal of the need to provide, or rely on, quadrature imbalance measurement functionality.

(ii) Quadrature imbalance is not required to be determined during factory testing.

(iii) Quadrature imbalance may be determined periodically, or frequently, enabling variations in environmental conditions, as well as variations over time, to be compensated for.

(iv) In the case of performing quadrature imbalance measurements during an FCCh scan, normal receiver operation in VLIF mode is not precluded.

(v) Measuring the imbalance during an FCCh scan enables quadrature imbalance measurement to be performed regularly, if desired, and thereby enables changes over time or temperature to be tracked and if necessary compensated for.

In particular, it is envisaged that the aforementioned inventive concept may be applied by a semiconductor manufacturer to any integrated circuit architecture supporting an improved processor logic arranged to determine quadrature imbalance. It is further envisaged that, for example, a semiconductor manufacturer may employ the inventive concept in a design of a stand-alone device, or application-specific integrated circuit (ASIC) and/or any other sub-system element employing an integrated circuit to support an improved method for determining quadrature imbalance within a data communication unit.

It will be appreciated that any suitable distribution of functionality between different functional units or controllers or memory elements, may be used without detracting from the inventive concept herein described. Hence, references to specific functional devices or elements are only to be seen as references to suitable means for providing the described functionality, rather than indicative of a strict logical or physical structure or organization.

Aspects of the invention may be implemented in any suitable form including hardware, software, firmware or any combination of these. The elements and components of an embodiment of the invention may be physically, functionally and logically implemented in any suitable way. Indeed, the functionality may be implemented in a single unit or IC, in a plurality of units or ICs or as part of other functional units.

Although the invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the descried embodiments may be combined in accordance with the invention. In the claims, the term 'comprising' does not exclude the presence of other elements or steps.

Furthermore, although individual features may be included in different claims, these may possibly be advantageously combined, and the inclusion in different claims does not imply that a combination of features is not feasible and/or advantageous. Also, the inclusion of a feature in one category of claims does not imply a limitation to this category, but rather indicates that the feature is equally applicable to other claim categories, as appropriate.

Furthermore, the order of features in the claims does not imply any specific order in which the features must be performed and in particular the order of individual steps in a method claim does not imply that the steps must be performed in this order. Rather, the steps may be performed in any suitable order. In addition, singular references do not exclude a plurality. Thus, references to 'a', 'an', 'first', 'second' etc. do not preclude a plurality.

Thus, an improved method and apparatus for determining quadrature imbalance within a wireless communication unit have been described, where the aforementioned disadvantages with prior art arrangements have been substantially alleviated.

The invention claimed is:

1. An integrated circuit comprising: radio frequency (RF) receiver circuitry arranged to receive a wireless network signal, wherein the receiver circuitry generates in-phase and quadrature digital baseband representations of the wireless network signal; and
processing logic operably coupled to the radio frequency (RF) receiver circuitry and arranged to:
determine quadrature (I/Q) imbalance of the RF receiver circuitry based on the in-phase and quadrature digital baseband representations of the wireless network signal, wherein the processing logic is arranged to set the RF receiver circuitry to operate in a direct conversion radio (DCR) mode for the purpose of determining quadrature imbalance and determine quadrature imbalance only in the DCR mode; and
to set the RF receiver circuitry to operate in an intermediate frequency (I/F) mode when I/Q imbalance has been determined.

2. The integrated circuit of claim 1, wherein the processing logic is arranged to calibrate the RF receiver circuitry to compensate for quadrature imbalance of the RF receiver circuitry.

3. The integrated circuit of claim 1, wherein the processing logic is arranged to determine quadrature imbalance based on measurements of in-phase and quadrature digital baseband representations of a network signal received as part of a power scan operation.

4. The integrated circuit of claim 3, wherein: the processing logic is further arranged to synchronise signal timing of a wireless communication unit containing the integrated circuit with a remote base station; and
the processing logic is arranged to determine quadrature imbalance prior to synchronisation with the remote base station.

5. The integrated circuit, of claim 1, wherein the processing logic is arranged to determine quadrature imbalance based on measurements of in-phase and quadrature digital baseband representations of a network signal received as part of a frequency control channel (FCCh) scan.

6. The integrated circuit of claim 5, wherein the processing logic is arranged to determine quadrature imbalance based on measurements of in-phase and quadrature digital baseband representations of a frequency correction burst (FCB) within the FCCh.

7. The integrated circuit of claim 1, further comprising an RFIC control signal, whereby the processing logic is to signal the RF receiver circuitry via the RFIC control signal to operate in the DCR mode.

8. A method for determining quadrature (I/Q) imbalance within radio frequency (RF) receiver circuitry of a wireless communication unit, the method comprising the steps of:
receiving a wireless network signal;
setting a first signal generated by a local oscillator of the RF receiver circuitry to a first frequency for the purpose of measuring quadrature imbalance;
generating in-phase and quadrature digital baseband representations of the wireless network signal;

determining quadrature (I/Q) imbalance of the RF receiver circuitry based on the in-phase and quadrature digital baseband representations of the wireless network signal; and setting a second signal generated by the local oscillator of the RF receiver circuitry to a second frequency for the purpose of normal operations, wherein the first frequency is not used for the purpose of normal operations.

9. The method of claim 8 further comprising calibrating the RF receiver circuitry to compensate for quadrature imbalance of the RF receiver circuitry in response to said determination.

10. The method of claim 8 further comprising setting the local oscillator of the RF receiver circuitry to generate the frequency of the first signal wherein the first signal, when mixed with the received wireless network signal, shifts a frequency of the received wireless network signal to a baseband frequency, thereby causing the RF receiver circuitry to operate in a direct conversion radio (DCR) mode prior to determining quadrature imbalance.

11. The method of claim 8 further comprising determining quadrature imbalance based on measurements of in-phase and quadrature digital baseband representations of a network signal received as part of a power scan operation.

12. The method of claim 8 further comprising determining quadrature imbalance based on measurements of in-phase and quadrature digital baseband representations of a network signal received as part of a frequency control channel (FCCh) scan.

13. The method of claim 12 further comprising determining quadrature imbalance based on measurements of in-phase and quadrature digital baseband representations of a frequency correction burst within the FCCh.

14. The method of claim 8, wherein:
the RF receiver circuitry is operating in a very low intermediate frequency (VLIF) mode during normal operations;
the VLIF is a positive frequency; and
the setting the first signal comprises setting the frequency of the first signal generated by the local oscillator of the RF receiver circuitry, whereby a tone energy of an output of the RF receiver circuitry to an analogue to digital converter (ADC) on the received wireless network signal lies between the VLIF frequency and a frequency of zero.

15. The method of claim 8, wherein:
the RF receiver circuitry is operating in a very low intermediate frequency (VLIF) mode during normal operations;
the VLIF is a positive frequency; and
the setting the first signal comprises adding an offset to one or more mixers of the RF receiver circuitry, whereby a tone energy of an output of the RF receiver circuitry to an ADC on the received wireless network signal lies between the VLIF frequency and a frequency of zero.

16. The method of claim 15, wherein:
the received wireless network signal comprises an FCCh tone; and
the setting comprises setting the frequency of the signal generated by the local oscillator of the RF receiver circuitry whereby an FCCh tone energy of the output of the RF receiver circuitry to the ADC on the received FCCh tone lies between the VLIF frequency and a frequency of zero.

17. A wireless communication unit comprising an integrated circuit according to claim 1, wherein:
in the DCR mode, the processing logic is arranged to determine the I/Q imbalance based on the in-phase and quadrature digital baseband representations of the received wireless network signal; and
in the I/F mode, the RF receiver circuitry is to transform received other wireless network signals to signals at an intermediate frequency, to transform the signals at the intermediate frequency to baseband, and to transform the baseband to audio for a user of the wireless communication unit.

18. The wireless communication unit of claim 17, wherein the wireless communication device is one of a private mobile radio, a cellular phone, a personal digital assistant, a wireless capable laptop computer.

19. The wireless communication unit of claim 18, wherein the cellular phone supports at least one of the following communication formats: Global System for Mobile communications (GSM), general packet radio system (GPRS), enhanced general packet radio system (EGPRS), and enhanced GSM (EGSM).

* * * * *